United States Patent

[11] 3,619,732

[72] Inventor Ronald G. Neale
Birmingham, Mich.
[21] Appl. No. 825,236
[22] Filed May 16, 1969
[45] Patented Nov. 9, 1971
[73] Assignee Energy Conversion Devices, Inc.

[54] COPLANAR SEMICONDUCTOR SWITCH STRUCTURE
11 Claims, 14 Drawing Figs.

[52] U.S. Cl. .......... 317/234 R, 317/234 V, 317/234 N, 317/235 K, 317/235 P, 338/20
[51] Int. Cl. .......... H03k17/00, H01l 5/02, H01l 3/00
[50] Field of Search .......... 338/331, 333; 317/234 (10), 234 (5.4), 234, 235; 313/325; 315/35, 36

[56] References Cited

UNITED STATES PATENTS

| | | | |
|---|---|---|---|
| 3,271,591 | 9/1966 | Ovshinsky | 317/235 X |
| 3,327,137 | 6/1967 | Ovshinsky | 317/234 UX |
| 3,385,731 | 5/1968 | Weimer | 317/235 UX |
| 3,436,619 | 4/1969 | Diemer et al. | 317/235 UX |
| 3,442,647 | 5/1969 | Klasens | 317/235 UX |

*Primary Examiner*—James D. Kallam
*Assistant Examiner*—William D. Larkins
*Attorney*—Wallenstein, Spangenberg, Hattis, Strampel & Fiorito

ABSTRACT: A coplanar semiconductor switch structure comprises a pair of electrodes deposited as a film on a suitable substrate with a gap formed between the ends of the electrodes, and an active semiconductor material deposited as a film in the gap between the ends of the electrodes. The ends of the deposited electrodes are so formed as to provide a minimum gap distance therebetween with increasing gap distance on each side thereof to provide a preferred location for the conducting path or paths through the active semiconductor material between the electrodes. The film thickness of the deposited acting semiconductor material is greater than the largest transverse dimension or diameter of the conducting path or paths so to be totally confined in the material. The active semiconductor material may be made to extend substantially equally from each side of the gap between the electrodes so that the current conducting path or paths may be symmetrical about an axis between the electrodes.

Inventor
Ronald G. Neale
By: Wallenstein, Spangenberg, Hattis & Strampel
Attys

Inventor
Ronald G. Neale

By: Wallenstein, Spangenberg, Hattis & Strampel
attys.

COPLANAR SEMICONDUCTOR SWITCH STRUCTURE

The semiconductor switch devices of this invention constitute improvements over the switch devices disclosed in Standord R. Ovshinsky U.S. Pat. No. 3,271,591, such switch devices including a pair of electrodes with an active semiconductor material therebetween and being of the nonmemory type and the memory type depending upon the active semiconductor materials utilized therein.

The active semiconductor materials are preferably polymeric type materials including a plurality of chemically dissimilar elements, at least some of which are of the polymeric type having the ability to form polymeric structures. Such polymeric type elements include boron, carbon, silicon, germanium, tin, lead, nitrogen, phosphorous, arsenic, antimony, bismuth, oxygen, sulfur, selenium, tellurium, hydrogen, fluorine and chlorine. Of these polymeric-type elements, oxygen, sulfur, selenium and tellurium are particularly useful since they, and mixtures containing them, have favorable carrier mobility characteristics. Of these polymeric-type elements, silicon, germanium, phosphorous, arsenic and the like and, also, aluminum, gallium, indium, lead, bismuth and the like are particularly useful since they effectively form covalent bonds and cross-links to return and maintain the active semiconductor materials in a substantially disordered and generally amorphous condition. Depending upon the composition of the active semiconductor materials, the switches may be of the nonmemory type or the memory type. Examples of such materials are set forth in the aforementioned patent to provide such nonmemory and memory operations (the nonmemory devices being referred to therein as Mechanism devices and the memory devices as Hi-Lo and Circuit Breaker devices).

The active semiconductor materials are normally in the substantially disordered and generally amorphous condition providing high resistance for blocking current between the electrodes substantially equally in each direction. They have local order and/or localized bonding of the atoms and a high density of local states in the forbidden band which provide high resistance and a threshold voltage value. When a voltage above the threshold voltage value is applied to the electrodes, at least one current conducting filament or path is established in the semiconductor material between the electrodes which is of low resistance for conducting current substantially equally in each direction. The transverse dimensions or diameter of said at least one current conducting filament or path are determined by the amount of current flow, they increasing in accordance with increase in current density to accommodate the current flow.

In the nonmemory-type devices the active semiconductor materials in the current conducting path or paths in the low resistance conducting condition remain substantially in the substantially disordered and generally amorphous condition, there being no significant change in structural state. The low resistance or conducting condition in the current conducting path or paths reverts to the high resistance or blocking condition when the current therethrough decreases below a minimum current holding value.

In the memory-type devices, the semiconductor material in the current conducting path or paths is subjected to changes in local order and/or localized bonding of the molecular structure which changes are frozen in. These changes, providing changes in atomic structure and, hence, structural change in the semiconductor materials, can be from said disordered condition to a more ordered condition, such as, for example, toward a more ordered crystallinelike condition. The changes can be substantially within a short range order itself still involving a substantially disordered and generally amorphous condition, or can be from a short range order to a long range order which could provide a crystallinelike or pseudo crystalline condition, all of these structural changes, however subtle, involving at least a change in local order and/or localized bonding. These changes in structural state, which are frozen in, provide a conducting path or paths which remain even though the current therethrough is reduced to zero or reversed. To reset the memory devices to the high resistance or blocking condition, a high current pulse is passed through the current conducting path or paths whereupon the more ordered structural state thereof is realtered to the substantially disordered and generally amorphous condition of high resistance which is frozen in. Complete reversibility between these conditions of high resistance and low resistance is at all times assured.

The principal object of this invention is to provide improved semiconductor switch devices as discussed above, whether of the nonmemory type or the memory type, which are coplanar, that is, where coplanar electrodes are deposited as films on a suitable substrate with a gap formed between the ends of the electrodes and where the active semiconductor material is deposited as a film in the gap between the ends of the electrodes.

Briefly, in accordance with this invention, the ends of the deposited electrodes, which form the gap therebetween in which the active semiconductor material film is deposited, are so formed in the plane of the electrodes as to provide a minimum gap distance between the electrodes with increasing gap distances on each side thereof. The minimum gap distance provides the shortest and preferred path or paths through the semiconductor material film along which the path or paths of low resistance may most readily form pursuant to the application of a voltage above the threshold voltage value to the electrodes. By reason of this electrode configuration the threshold voltage values of the switch devices are maintained substantially uniform which would not otherwise usually be the case.

Also, briefly, in accordance with this invention, the thickness of the active semiconductor material film deposited in the gap between the electrodes is greater than the largest transverse dimensions or diameter of the current conducting path or paths through the material between the electrodes so that the conducting path or paths are totally confined in the semiconductor material film and do not burst from the surface thereof.

Further, briefly, in accordance with this invention, the active semiconductor material may be made to extend substantially equally from each side of the gap so that the current conducting path or paths may be symmetrical about an axis between the electrodes. This symmetry assures stability of the current conducting path or paths to provide uniform operation.

Many other objects, features and advantages of this invention will become more fully realized and understood from the following detailed description when taken in conjunction with the accompanying drawings wherein like reference numerals throughout the various views of the drawings are intended to designate similar elements or components.

The coplanar deposited film electrode structure of this invention may have many uses in the field of integrated electronic circuit but has particular utility in the construction of certain kinds of switch devices of the memory and threshold type.

Figure 1:
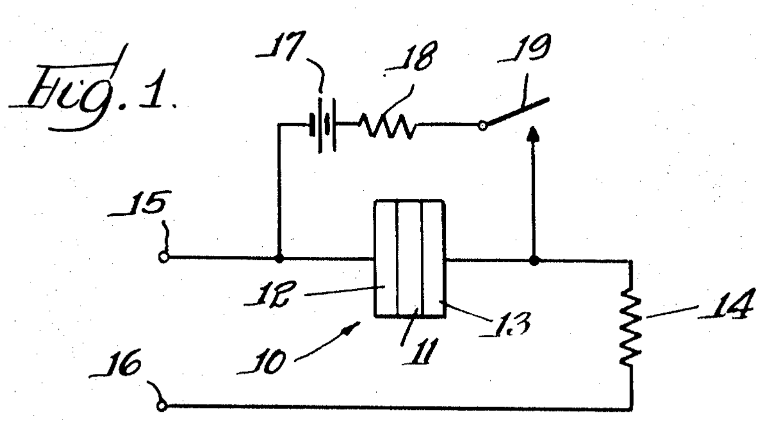
FIG. 1 is a diagrammatic illustration of the current controlling device made by this invention and is shown connected in series in a load circuit.

For an understanding of the nature and manner of operation of the memory and nonmemory or threshold semiconductor switch devices as constructed in accordance with this invention reference is first made to FIG. 1 of the drawings where there is illustrated a typical simple load circuit which includes a semiconductor switch device 10 diagrammatically illustrated as having a semiconductor element 11 which may be of high electrical resistance and a pair of electrodes 12 and 13 in contact therewith with low electrical resistance of transition. The electrodes 12 and 13 of the current controlling device 10 connect the same in series in an electrical load circuit having a load 14 and a pair of terminals 15 and 16 for applying power thereto. The power supplied may be a DC voltage or an AC voltage as desired. The circuit arrangement illustrated in FIG. 1, and as so far described, is applicable for the nonmemory or threshold type of current controlling device. If a memory type of current controlling device is utilized, the circuit also includes a source of current 17, a low resistance 18 and a switch 19 connected to the electrodes 12 and 13 of the current controlling device. The purpose of this auxiliary circuit is to switch the memory-type device from its stable conducting condition of low resistance to its stable blocking condition of high resistance by the application of an energy pulse. The resistance value of the resistance 18 is preferably considerably less than the resistance value of the load 14.

The semiconductor element 11 may be formed into a body, but in accordance with this invention the foregoing solid state semiconductor materials are preferably deposited on a suitable smooth substrate, which may be a semiconductor, or an insulator, as by vacuum deposition, sputtering or the like, to provide films of the semiconductor material on the substrate in a substantially disordered and generally amorphous solid state condition. The solid state semiconductor materials normally assume this state as they are deposited or they may be readily made to assume this state by other means. Electrodes in the form of deposited films may be applied to the semiconductor materials and the control of current is accomplished through the electrodes and semiconductor materials. For example, when spaced apart coplanar electrodes are used and the semiconductor material is deposited so as to fill the gap between the electrodes current will flow from one electrode through a path of paths in the semiconductor material to the other electrode.

Figures 2, 3, 4, 5, 6, 7:
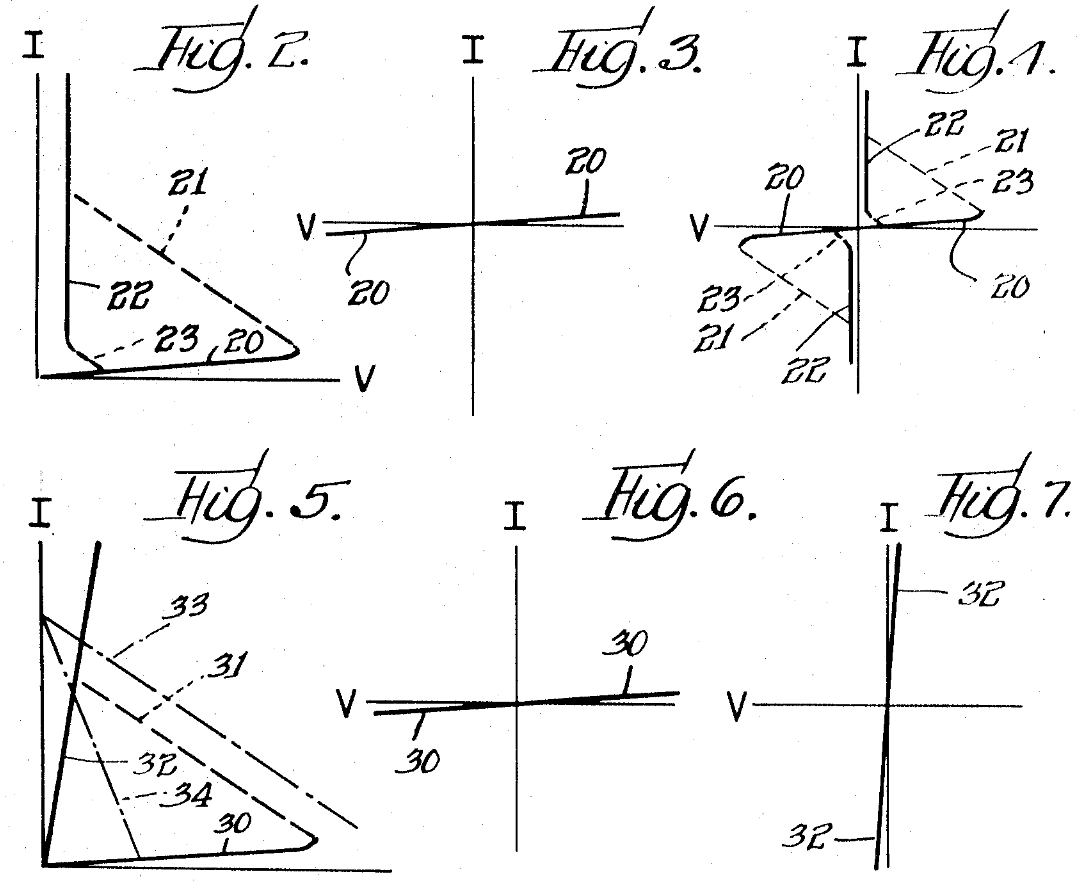
FIG. 2 is a voltage current curve illustrating the operation of the nonmemory or threshold-type current-controlling device made by this invention when operated in a DC load circuit.
FIGS. 3 and 4 are voltage current curves illustrating the symmetrical operation of the nonmemory or threshold-type current controlling device made by this invention when operated in an AC load circuit.
FIG. 5 is a voltage current curve illustrating the operation of the memory-type current controlling device made by this invention when operated in a DC load circuit.
FIGS. 6 and 7 are voltage current curves illustrating the symmetrical operation of the memory-type current controlling device and operation thereof when operated in an AC load circuit.

The general voltage-current characteristics of semiconductor devices made as mentioned hereinabove are shown in FIGS. 2–7 where FIG. 2 is an I–V curve illustrating the DC operation of the nonmemory or threshold-type device 10 and in this instance the switch 19 always remains open. The device 10 is normally in its high resistance blocking condition and as the DC voltage is applied to the terminals 15 and 16 and increased, the voltage current characteristic of the device are illustrated by the curve 20, the electrical resistance of the device being high and substantially blocking the current flow therethrough. When the voltage is increased to a threshold voltage value, the high electrical resistance in the semiconductor material substantially instantaneously decreases in at least one path between the electrodes 12 and 13 to a low electrical resistance, the substantially instantaneous switching being indicated by the curve 21. This provides a low electrical resistance or conducting condition for conducting current therethrough. The low electrical resistance in many orders of magnitude less than the high electrical resistance. The conducting condition is illustrated by the curve 22 and it is noted that there is a substantially linear voltage current characteristic and a substantially constant voltage characteristic which are the same for increase and decrease in current. In other words, current is conducted at a substantially constant voltage. In the low resistance current conducting condition the semiconductor element has a voltage drop which in a minor fraction of the voltage drop in the high resistance blocking condition near the threshold voltage value.

As the supply voltage is decreased, the current decreases along the curve 22 and when the current decreases below a minimum current holding value, the low electrical resistance of said at least one path immediately returns to the high electrical resistance as illustrated by the curve 23 to reestablish the high resistance blocking condition. In other words, a current is required to maintain the threshold switch current controlling device in its conducting condition and when the current falls below a minimum current holding value, the low electrical resistance immediately returns to the high electrical resistance.

The threshold switch current controlling device 10 used in this invention is symmetrical in its operation, it blocking current substantially equally in each direction and it conducting current substantially equally in each direction, and the switching between the blocking and conducting conditions being extremely rapid. In the case of AC operation, the voltage current characteristics for the second half cycle of the AC current would be in the opposite quadrant from that illustrated in FIG. 2. The AC operation of the device is illustrated in FIGS. 3 and 4. FIG. 3 illustrates the device 10 in its blocking condition where the peak voltage of the AC voltage is below the threshold voltage value of the device, the blocking condition being illustrated by the curve 20 in both half cycles. When, however, the peak voltage of the applied AC voltage increases above the threshold voltage value of the device, the device is substantially instantaneously switched along the curves 21 to the conducting condition illustrated by the curves 22, the device switching during each half cycle of the applied AC voltage. As the applied AC voltage nears zero so that the current through the device falls below the minimum current holding value, the device switches along the curves 23 from the low electrical resistance condition to the high electrical resistance condition illustrated by the curve 20, this switching occurring near the end of each half cycle.

As expressed above, there is no substantial change in phase or physical structure of the threshold switch semiconductor material as it is switched between the blocking and conducting conditions, and since the semiconductor material of the element 11 is substantially disordered and generally amorphous, said at least one conducting path through the semiconductor element is also substantially disordered and generally amorphous in the conducting condition and has an apparent diameter of transverse dimension corresponding to the current flow therein. The current conducting path or paths formed through the semiconductor material have the apparent ability to acquire a diameter or transverse dimension proportional to the current density within the path or paths, and the diameter or transverse dimension of the path or paths decreases with decreasing current and increases with increasing current so as to maintain a substantially constant voltage drop across said path or paths irrespective of the amount of current flow therethrough.

FIG. 5 is an I–V curve illustrating the DC operation of the memory switch-type current controlling device 10. The device is normally in its high resistance blocking condition and as the DC voltage is applied to the terminals 15 and 16 and increased, the voltage current characteristics of the device are illustrated by the curve 30, the electrical resistance of the device being high and substantially blocking the current flow therethrough. When the voltage is increased to a threshold voltage value, the high electrical resistance in the semiconductor element 11 substantially instantaneously decreases in at least one path between the electrodes 12 and 13 to a low resistance conducting condition, the substantially instantaneous switching being indicated by the curve 31. The low electrical resistance is many orders of magnitude less than the high electrical resistance. The conducting condition is illustrated by the curve 32 and it is noted that there is a substantially ohmic voltage current characteristic. In other words, current is conducted substantially ohmically as illustrated by the curve 32. In the low resistance current conducting condition the semiconductor material has a voltage drop which is a minor fraction of the voltage drop in the high resistance blocking condition near the threshold voltage value. Here it is believed that the conductive path or paths, which may be considered as a filament or filaments permanently formed in the semiconductor material, is of substantially fixed diameter during variation of current flow therethrough, and the diameter or transverse dimension of the path or paths is principally determined at the time of initial conduction in accordance with the amount of current passing therethrough such that when the current conducting path or paths is frozen in, only large amounts of current flow will cause sufficient heating within the semiconductor material in the region of said path or paths to cause the path or paths to increase in diameter or transverse dimension.

As the voltage is decreased, the current decreases along the curve 32 and due to the ohmic relation the current decreases to zero as the voltage decreases to zero. The memory type current controlling device has memory of its conducting condition and will remain in this conducting condition even though the current is decreased to zero or reversed until switched to its blocking condition as hereafter described. The load line of the load circuit is illustrated at 33, it being substantially parallel to the switching curve 31. When a DC current pulse is applied independently of the load circuit to the memory-type device as by the voltage source 17, low resistance 18 and switch 19 in FIG. 1, the load line for such current is along the line 34 since there is very little, if any, resistance in this control circuit, and as the load line 34 intersects the curve 30, the conducting condition of the device is immediately realtered and switched to its blocking condition. The memory-type device will remain in its blocking condition until switched to its conducting condition by the reapplication of a threshold voltage to the device through the terminals 15 and 16.

The memory switch-type current controlling device 10 used in this invention is also symmetrical in its operation, it blocking current substantially equally in each direction and it conducting current substantially equally in each direction, and the switching between the blocking and conducting conditions being extremely rapid. In the case of AC operation, the voltage current characteristics for the second half cycle of the AC current would be in the opposite quadrant from that illustrated in FIG. 5. The AC operation of the memory-type device is illustrated in FIGS. 6 and 7. FIG. 6 illustrates the device 10 in its blocking condition where the peak voltage of the AC voltage is below the threshold voltage value of the device, the blocking condition being illustrated by the curve 30 in both half cycles. Thus, the device blocks current equally in both half cycles. When, however, the peak voltage of the applied AC voltage increases above the threshold value of the memory-type device, the device substantially instantaneously switches to the conducting condition illustrated by the curve 32 and it remaining in this conducting condition regardless of the reduction of the current to zero or the reversal of the current. This symmetrical conducting condition is illustrated by the curve 32 in FIG. 7.

When the switch 19 is manipulated and the voltage applied to the terminals 15 and 16 is below the threshold voltage value, the memory switch-type current controlling device 10 is immediately switched to its blocking condition as illustrated by the curve 30 in FIG. 6. As expressed above, the semiconductor element is substantially disordered and generally amorphous in its blocking condition and said at least one path through the element is more ordered in the conducting condition. Therefore, in contrast to the nonmemory or threshold switch-type materials, the local order and localized bonding of the substantially disordered and generally amorphous condition of the memory switch-type material can be altered so that a conducting path or paths is established in the material in a quasi permanent manner. In other words, the conductivity of the memory switch-type semiconductor materials may be drastically altered to provide a conducting path or paths in the material which are frozen in and have a diameter corresponding to the initial current flow therethrough but which can be realtered to its original high resistance condition by the application of an energy pulse, for example a current pulse, through the conducting path or paths.

The electrodes which are utilized in semiconductor switch devices of this invention may be substantially any good electrical conductor, preferably high melting point materials, such as tantalum, niobium, tungsten and molybdenum or mixtures thereof, it being understood that other materials may be used. These electrodes are usually relatively inert with respect to the various aforementioned active semiconductor materials, when deposited as thin films or layers.

Figures 8, 9, 10, 11, 12, 13, 14:
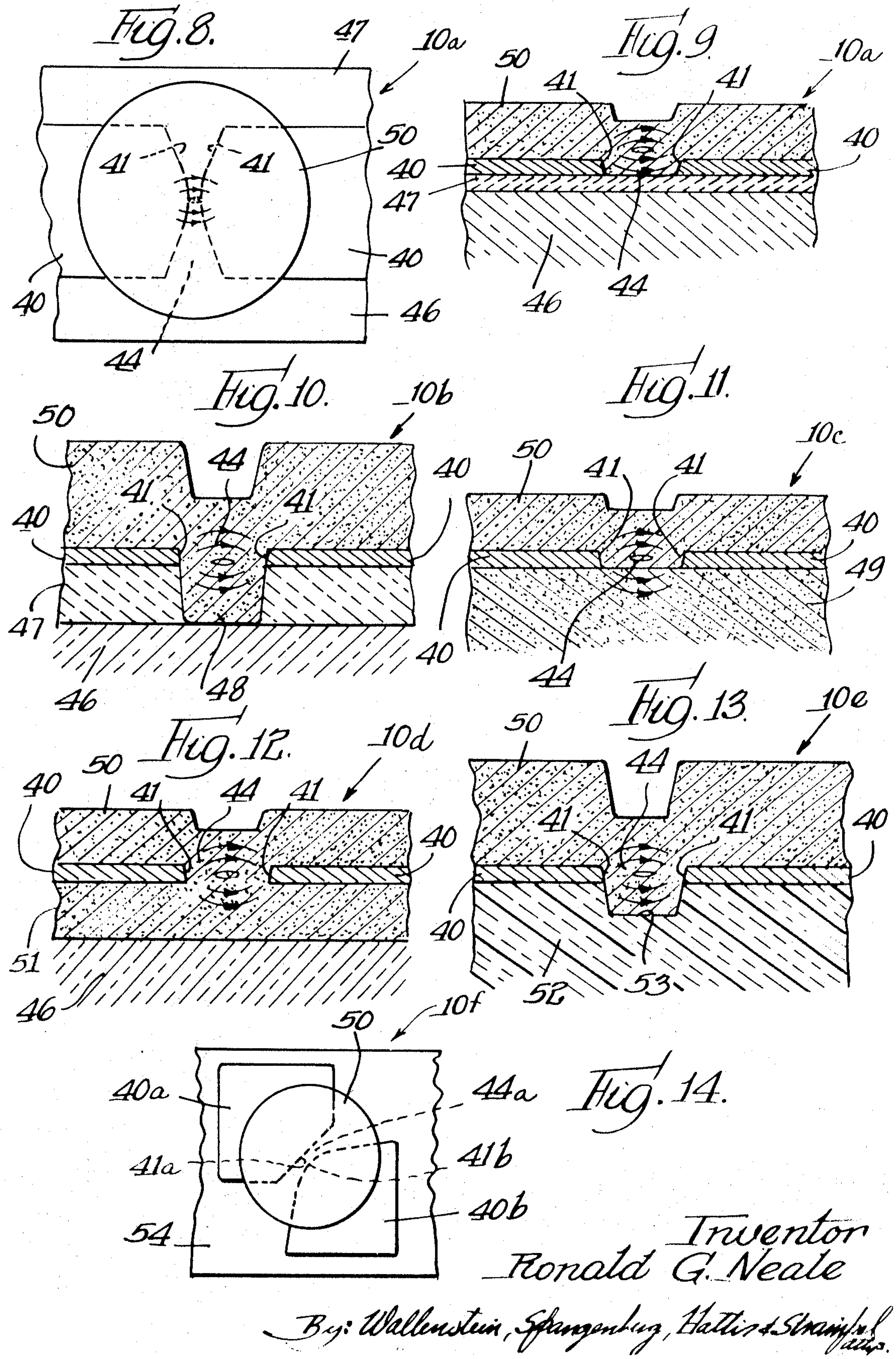
FIG. 8 is an enlarged plan view of a portion of one form of the coplanar semiconductor switch device of this invention.
FIG. 9 is a sectional view through the switch device of FIG. 8.
FIG. 10 is a sectional view through another form of the switch device.
FIG. 11 is a sectional view of still another form of the switch device.
FIG. 12 is a sectional view of a further form of the switch device.
FIG. 13 is a sectional view of still a further form of the switch device.
FIG. 14 is an enlarged plan view of a portion of a modified coplanar semiconductor switch device having a different electrode configuration.

Referring now to FIGS. 8 and 9, a portion of one form of the coplanar semiconductor switch device of this invention is generally designated at **10*a*, it corresponding electrically to the switch device 10 of FIG. 1. It includes a substrate 46, such as glass or the like, upon which is deposited by vacuum deposition, sputtering or the like a layer or film 47 of a passivating dielectric, such as, alumina or the like. Electrodes 40 of the aforementioned electrode materials, preferably molybdenum, are then deposited as a film on the passivating dielectric layer by vacuum deposition, sputtering or the like. The adjacent ends 41 of the electrodes 40 are shaped into rounded or circular configurations to provide a gap 44 therebetween having a central minimum gap dimension and increasing dimensions on each side thereof. Other configurations may be utilized, such as pointed or the like, if desired. This gap 44 may be provided during the deposition of the electrodes by using suitable masking, or it may be formed by first depositing a continuous strip of the electrode film and then etching the gap therein by utilizing suitable masking. A film or layer 50 of active semiconductor material is then deposited, as by vacuum deposition, sputtering or the like, over the electrodes 40 and into the gap 44 between the electrode ends 41**, the active semiconductor material being substantially disordered and generally amorphous and being appropriately selected from the material discussed above depending upon the electrical and switching characteristics desired. Depending upon the active semiconductor materials utilized, the switching device may be of the memory type or of the nonmemory or threshold type.

As a specific example, the film electrodes may have a thickness within a range of about 0.2 to 5 microns and preferably a minimum thickness of about 1 micron. The width of the electrodes is not critical, but electrodes having a width of 0.016 inch have proven extremely satisfactory. The rounded portions of the ends 41 of the electrodes may have various radii of curvature, good results having been had with radii between 0.008 and 0.125 inch. The minimum gap distance may be selected as desired, it being a factor, among others, in determining the threshold voltage value of the switch device, the larger the minimum gap dimension, the higher the threshold voltage value. A minimum gap dimension of 10 microns has given exceptional results and has provided threshold voltage values in excess of 60 volts depending upon the semiconductor materials used.

When a voltage of at least the threshold voltage value of the device is applied to the electrodes 40, at least one current conducting path or filament appears through the active semiconductor material 50 between the electrodes 40 is indicated by the arrows in FIGS. 8 and 9. Because of the configurations of the electrode ends 41, the path or paths follow the minimum gap dimension and are thus consistently located in the semiconductor material film. As expressed above, the diameter or transverse dimension of the path or paths is determined by the current density and it has been found that the diameter or transverse dimension thereof may well be in the neighborhood of 10 microns. Also, in accordance with this invention, the thickness of the deposited active semiconductor film is made such as to wholly encompass the conducting path or paths. In this particular instance the active film has a thickness of about 14 microns to give clearance on either side of the path or paths of two microns.

FIGS. 10 to 13 are partial views similar to FIG. 9 showing other forms of the switch device of this invention wherein the conducting path or paths are symmetrical about the axis of the minimum gap dimension between the contoured ends 41 of the electrodes 40. Here, the electrodes 40 may have the same configuration as those of FIG. 8, and here, also, it is assumed that the minimum gap dimension and the thickness of the electrodes are as described above in connection with FIGS. 8 and 9.

The switch device of FIG. 10 is generally The film at 10*b*, and it includes an insulating substrate 46 upon which is deposited a relatively thick film 47 of alumina or the like. In the specific example under consideration, this alumina film has a thickness of about 6 microns. A strip film of electrode material is deposited on the alumina film 47, and then by suitable etching with masking or the like, the gap 44 is formed between the electrode ends 41 and a cavity 48 is formed in the alumina film 47 below the gap 44. The film 50 of active semiconductor material is then deposited over the electrodes 40 and in the gap 44 and cavity 48, this film having a thickness of about 14 microns. Thus, it is seen that there is substantially 6 microns of active semiconductor material in the cavity 48 below the gap 44 and at least substantially 6 microns of the same above the gap 44. As a result, the current conducting path or paths, shown by the arrows and having a diameter or transverse dimension of about 10 microns, can symmetrically form about the axis of the minimum gap dimension between the electrode ends 41 and still be completely encompassed by the active semiconductor material.

In FIG. 11 another form of the switch device is generally designated at 10*c*. Here, a substrate 49 of active semiconductor material is utilized, it being in the substantially disordered and generally amorphous state and being in bulk form. The electrodes 40 are deposited thereon and the ends 41 thereof are contoured to provide a gap 44 as described above. A film 50 of active semiconductor material is deposited over the electrodes 40 and in the gap 44, this film 50 contacting the substrate 49 of active semiconductor material. The compositions of the active semiconductor materials in the film 50 and substrate 49 are preferably the same. The thickness of the film 50 is substantially 7 microns so that the conducting path or paths which are formed in both the film and substrate are symmetrical about the axis of the minimum gap dimension between the electrodes 40, as shown by the arrows, and wholly encompassed by the semiconductor material.

The switching device generally designated at 10*d* in FIG. 12 includes a substrate of glass or the like upon which is deposited a film 51 of active semiconductor material as by vacuum deposition, sputtering or the like. The electrodes 40 are deposited thereon and the ends 41 thereof are contoured to provide a gap 44 as described above. A film 50 of active semiconductor material is deposited over the electrodes 40 and in the gap 44, this film 50 contacting the film 51 in the gap 44. The compositions of the active semiconductor materials in the films 51 and 50 are preferably the same. Here, the deposited film 51 is preferably at least 6 microns thick and the film 50 preferably 7 microns thick so that the conducting path or paths which are formed in both films 51 and 50 are symmetrical about the axis of the minimum gap dimension between the electrodes 40, as shown by the arrows, and wholly encompassed by the semiconductor material of the films.

The semiconductor switch devices of this invention are particularly adapted for use in integrated circuits since they may be readily formed as an integral part thereof using the techniques described above. As a further illustration of the use of the switch devices of this invention reference is made to FIG. 13 wherein a switch device is generally designated at 10*e*. Here, a substrate 52 may be a conventional substrate used in integrated circuits upon which are deposited various passive components, such as, resistors, capacitors or the like, and which are electrically connected by conductors also deposited on the substrate. The switch devices of this invention may be readily incorporated in the integrated circuits by incorporating them directly in the deposited conductors.

In FIG. 13, the deposited conductors of the integrated circuit (which are deposited on the substrate 52) are designated at 40 and they may be interrupted by suitable etching to provide the switch electrodes 40 having their ends 41 forming a gap 44 therebetween. In etching the conductors to form the gap 44, a cavity 53 may also be formed in the substrate 52 below the gap 44, much as described above in connection with FIG. 10. The entire integrated circuit including the conductors and passive elements may be covered with a film 50 of active semiconductor material which is substantially disordered and generally amorphous and of high resistance so that it will have no effect upon the electrical characteristics of the integrated circuit while at the same time protecting the same. In so depositing this film 50 of active semiconductor material, it is also deposited in the gap 44 and the cavity 53 to form the switch device 10*e* of this invention. As in FIG. 10, the cavity 53 may have a depth of about 6 microns and the film 50 may have a thickness of about 14 microns. The switch device 10*e* of FIG. 13 operates in substantially the same way as the switch device 10*b* of FIG. 10 and, therefore, a further description of the operation is not considered necessary. If desired, the film 50 can be deposited only at the switching points in the integrated circuit rather than over the entire circuit. The substrate 52 in FIG. 13 is preferably formed of a passive material but it may also be formed of an active semiconductor material. In this latter event, the etching of the cavity may be dispensed with so that the switch device would conform more closely to that of FIG. 11.

The switch device generally designated at 10*f* in FIG. 14, is very much like those disclosed in FIGS. 8 to 13 except that it has a different electrode configuration. Here, the substrate 54 has electrodes 40*a* and 40*b* deposited thereon, the electrode 40*a* having a straight end 41*a* and the electrode 40*b* having a rounded end 41*b* forming a gap 44*a* therebetween which also has a minimum gap dimension with increasing gap dimensions on each side thereof. The film 50 of semiconductor material is deposited over the electrodes 40*a* and 40*b* and into the gap 44*a* in the same manner as described above in the other forms of the invention. The switch device 10*f* of FIG. 14 may also have any of the cross-sectional configurations illustrated in FIGS. 9 to 13.

While for purposes of illustration several forms of this invention have been disclosed, other forms thereof may become apparent to those skilled in the art upon reference to this disclosure and, therefore, this invention is to be limited only by the scope of the appended claims.

I claim:

1. A coplanar semiconductor switch device comprising a substrate, a pair of flat and spaced apart coplanar deposited film electrodes on said substrate and having their opposing ends contoured to provide a gap therebetween which has a minimum gap dimension with gradually increasing gap dimensions toward each side thereof, and a deposited film of active switchable semiconductor material over the electrodes and over and in the gap between the opposing ends of the electrodes, said active switchable semiconductor material being of relatively high resistance for blocking current and including means for substantially instantaneously establishing at least one current conducting path of relatively low resistance between the ends of the electrodes in response to the application of a voltage to the electrodes above a threshold voltage value, said at least one conducting path between the ends of the electrodes being positionally controlled by the minimum gap dimension and having transverse dimensions greater than the thickness of the deposited film electrodes, and the thickness of said deposited film of active semiconductor material being greater than the transverse dimensions of said at least one conducting path so as to wholly encompass the same.

2. A coplanar semiconductor switch device as defined in claim 1 wherein said deposited film of active semiconductor material extends substantially equally above and below the gap between the ends of said electrodes so as to wholly encompass said at least one conducting path when it is symmetrically centered in the gap between the ends of the electrodes.

3. A coplanar semiconductor switch device comprising a substrate, a pair of flat and spaced apart coplanar deposited film electrodes on said substrate and having a gap therebetween, and a deposited film of active switchable semiconductor material over the electrodes and over and in the gap between the opposing ends of the electrodes, said active switchable semiconductor material being of relatively high resistance for blocking current and including means for substantially instantaneously establishing at least one current conducting path of relatively low resistance between the ends of the electrodes in response to the application of a voltage to the electrodes above a threshold voltage value, said at least one conducting path between the ends of the electrodes having transverse dimensions greater than the thickness of said deposited film electrodes, said deposited film of active semiconductor material extending substantially equally above and below the gap between the ends of said electrodes and having a thickness greater than the transverse dimensions of said at least one conducting path so as to wholly encompass the same when it is centered in the gap between the ends of said electrodes.

4. A coplanar semiconductor switch device as defined in claim 3 wherein said pair of spaced apart coplanar deposited film electrodes are on a substrate of nonconductive material, and wherein said substrate is provided with a cavity immediately beneath said gap, and said deposited film of active semiconductor material fills said cavity and gap and extends above said gap a distance substantially equal to the depth of said cavity.

5. A coplanar semiconductor switch device as defined in claim 4 wherein said substrate is a deposited intermediate substrate film of nonconductive material.

6. A coplanar semiconductor switch device as defined in claim 5 wherein said cavity extends completely through said deposited intermediate substrate film.

7. A coplanar semiconductor switch device as defined in claim 3 wherein said pair of spaced apart coplanar deposited film electrodes are on a substrate of active semiconductor material.

8. A coplanar semiconductor switch device as defined in claim 1 wherein said semiconductor material includes means for reverting said at least one conducting path of relatively low resistance to the relatively high resistance blocking state when the current therethrough decreases below a minimum current holding value.

9. A coplanar semiconductor switch device as defined in claim 1 wherein said semiconductor material includes means for maintaining said at least one conducting path of relatively low resistance in the relatively low resistance conducting state even though the current therethrough decreases to zero, and for realtering said at least one conducting path of relatively low resistance to the relatively high resistance blocking state in response to a current pulse applied to the electrodes.

10. A coplanar semiconductor switch device as defined in claim 3 wherein said semiconductor material includes means for reverting said at least one conducting path of relatively low resistance to the relatively high resistance blocking state when the current therethrough decreases below a minimum current holding value.

11. A coplanar semiconductor switch device as defined in claim 3 wherein said semiconductor material includes means for maintaining said at least one conducting path of relatively low resistance in the relatively low resistance conducting state even though the current therethrough decreases to zero, and for realtering said at least one conducting path of relatively low resistance to the relatively high resistance blocking state in response to a current pulse applied to the electrodes.

* * * * *